USOO6137130A

United States Patent [19]
Sung

[11] Patent Number: 6,137,130
[45] Date of Patent: Oct. 24, 2000

[54] CAPACITOR OVER BIT LINE STRUCTURE USING A STRAIGHT BIT LINE SHAPE

[75] Inventor: Janmye Sung, Yang Mei, Taiwan

[73] Assignee: Vanguard International Semiconductor Corporation, Hsin-Chu, Taiwan

[21] Appl. No.: 09/455,357

[22] Filed: Dec. 6, 1999

Related U.S. Application Data

[62] Division of application No. 08/963,458, Nov. 3, 1997, Pat. No. 6,025,227.

[51] Int. Cl.⁷ .................................................. H01L 27/108
[52] U.S. Cl. ........................ 257/306; 257/296; 257/308; 257/309; 257/754; 257/755; 257/757; 257/532
[58] Field of Search ............................. 257/296, 306, 257/307, 308, 309, 310, 754, 755, 757, 532; 438/253, 254, 255, 396, 397, 398, 652, 655, 656, 657, 682, 683, 685

[56] References Cited

U.S. PATENT DOCUMENTS

| 5,252,517 | 10/1993 | Blalock et al. | 438/396 |
| 5,338,700 | 8/1994 | Dennison et al. | 438/253 |
| 5,597,764 | 1/1997 | Koh et al. | 438/631 |
| 5,606,189 | 2/1997 | Adan | 257/303 |
| 5,627,095 | 5/1997 | Koh et al. | 438/672 |
| 5,637,526 | 6/1997 | Song | 438/253 |
| 5,776,815 | 7/1998 | Pan et al. | 438/396 |
| 5,780,339 | 7/1998 | Liu et al. | 438/253 |

*Primary Examiner*—Carl Whitehead, Jr.
*Assistant Examiner*—Toniae M. Thomas
*Attorney, Agent, or Firm*—George O. Saile; Stephen B. Ackerman

[57] ABSTRACT

A method of creating a capacitor over bit line structure, used for high density, DRAM designs, has been developed. The process consists of creating a straight bit line shape, connected to an underlying polysilicon contact plug structure, which in turn contacts an underlying source and drain region. A storage node contact hole is opened through insulator layers and through the straight bit line shape. After passivation of the storage node contact hole with silicon nitride spacers, a storage node structure is formed on an overlying insulator layer, as well as in the storage node contact hole, overlying and contacting another polysilicon contact plug.

4 Claims, 8 Drawing Sheets

6,137,130

1

CAPACITOR OVER BIT LINE STRUCTURE USING A STRAIGHT BIT LINE SHAPE

This is a division of patent application Ser. No. 08/963,458, now U.S. Pat. No. 6,025,227, filing date Nov. 3, 1997, A Capacitor Over Bit Line Structure Using A Straight Bit Line Shape, assigned to the same assignee as the present invention.

BACKGROUND OF THE INVENTION (1) Field of the Invention

The present invention relates to a method of fabricating a dynamic random access memory, (DRAM), device, and more specifically to a method of fabricating a DRAM device with a capacitor structure overlying a straight bit line shape.

(2) Description of the Prior Art

The attainment of high density DRAM devices has been limited by the inability of the semiconductor industry to provide the capacitor structures, needed for large scale DRAM integration. The limited area allotted for the capacitor structure has led to novel capacitor designs, targeted at increasing capacitor area, and thus increasing capacitance. One method of increasing capacitor surface area, while still minimizing cell size, has been the use of a capacitor over bit line, (COB), cell structure, where a storage node of the capacitor is formed upon a bit line. The use of the COB technology removes the limitation of the capacitor structure being placed in non-bit line regions, allowing capacitor structures with larger area, thus larger surface area and larger capacitances, to be used for DRAM devices.

This invention will describe a process for fabricating a COB structure in which a straight bit line shape is used. The straight line bit line shape consumes less area than multi-shaped COB structures, and also allows smaller photolithographic shapes to be achieved, thus allowing DRAM density increases to be realized. This invention will also provide a process for forming a storage node contact hole, through a narrow, straight bit line shape, to an underlying polysilicon contact plug structure, which in turn is in contact with a source and drain region of a transfer gate transistor, followed by passivation of the storage node contact hole, prior to forming the storage node contact structure. This process sequence also allows increased DRAM density to be obtained. Prior art, such as Koh, et al, in U.S. Pat. No. 5,627,095, describe a method for fabricating a DRAM structure, using novel techniques for forming bit lines and capacitor structures, however that prior art does not offer the process used to obtain the DRAM density improvements achieved in this invention via the use of a straight bit line shape, and a storage node contact hole, through a straight bit line shape.

SUMMARY OF THE INVENTION

It is an object of this invention to create a COB structure, using a straight bit line shape, for application in high density DRAM cells.

It is another object of this invention to use polysilicon contact plugs, between storage node structures, and underlying source and drain regions.

It is still another object of this invention to form the storage node contact hole through a straight bit line shape, followed by the creation of an insulator spacer on the sides of the storage node contact hole, prior to formation of the storage node structure.

In accordance with the present invention a process used to obtain a COB structure for use in high density DRAM cells,

2 featuring the use of straight bit line shapes, polysilicon contact plugs, and storage node contact holes, through the straight bit line shape, is described. Transfer gate transistor structures, on a thin gate structure, comprised of a polycide gate structure, capped with a silicon nitride layer, and accommodating a silicon nitride sidewall spacer, are formed. Polysilicon contact plugs are formed between silicon nitride passivated, polycide gate structures, via deposition and planarization procedures, with the polysilicon contact plugs overlying source and drain regions. A first silicon oxide layer is deposited, followed by the opening of a bit line contact hole, in the first silicon oxide layer, exposing a first polysilicon contact plug, followed by the formation of a bit line contact structure, filling the bit line contact hole. A metal deposition, followed by a patterning procedure, create a straight bit line shape, on the first silicon oxide layer, featuring contact of the straight bit line, to the first the bit line contact structure, in the bit line contact hole. A second silicon oxide layer is deposited, followed by patterning procedures, used to form a capacitor storage node contact hole, in the second silicon oxide layer, in the straight bit line shape, and in the first silicon oxide layer, contacting a second polysilicon contact plug. Insulator spacers are next formed on the sides of the capacitor storage node contact hole, followed by polysilicon deposition, and patterning, creating a capacitor storage node structure, contacting the second polysilicon contact plug, at the bottom of the capacitor storage node contact hole. The creation of a capacitor dielectric layer, on the capacitor storage node structure, followed by the formation of an upper electrode, complete the capacitor structure.

BRIEF DESCRIPTION OF THE DRAWINGS

The object and other advantages of this invention are best described in the preferred embodiments with reference to the attached drawings that include:

FIGS. 1a–6a, which schematically show the top view of the COB, DRAM device, at various stages of fabrication, featuring a straight bit line shape, polysilicon plugs, and capacitor storage node contact holes, opened through the straight bit line shape.

FIGS. 1b–6b, which schematically in cross-sectional style, show the significant fabrication stages, used to create the COB, DRAM device, with the straight bit line shape, with the polysilicon contact plugs, and with the capacitor storage contact hole, formed through the straight bit line shape.

DESCRIPTION OF THE PREFERRED EMBODIMENTS

The method of creating a COB structure, for a DRAM device, featuring a straight bit line shape, polysilicon contact plugs, and a storage node contact hole, opened through the straight bit line shape, will now be described in detail. The metal oxide semiconductor field effect transistor, (MOSFET), used for the transfer gate transistor of the DRAM device, will be described as an N type, (NFET), device. If desired the MOSFET device can easily be fabricated to be a P type, (PFET), device.

Figure 1A:
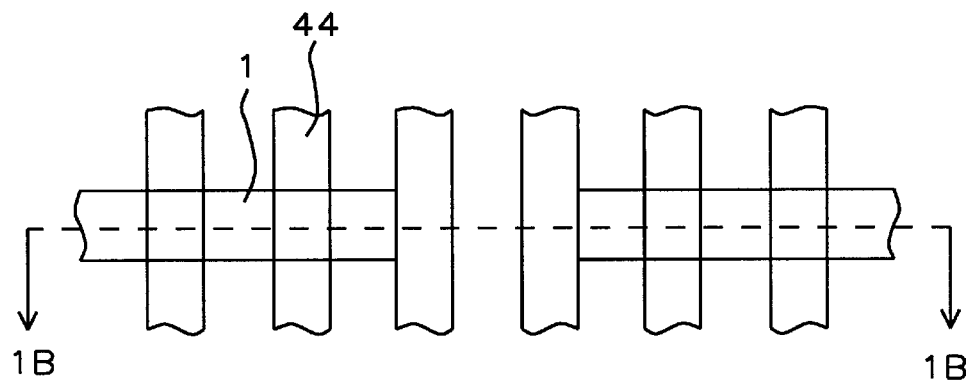
Figure 1B:
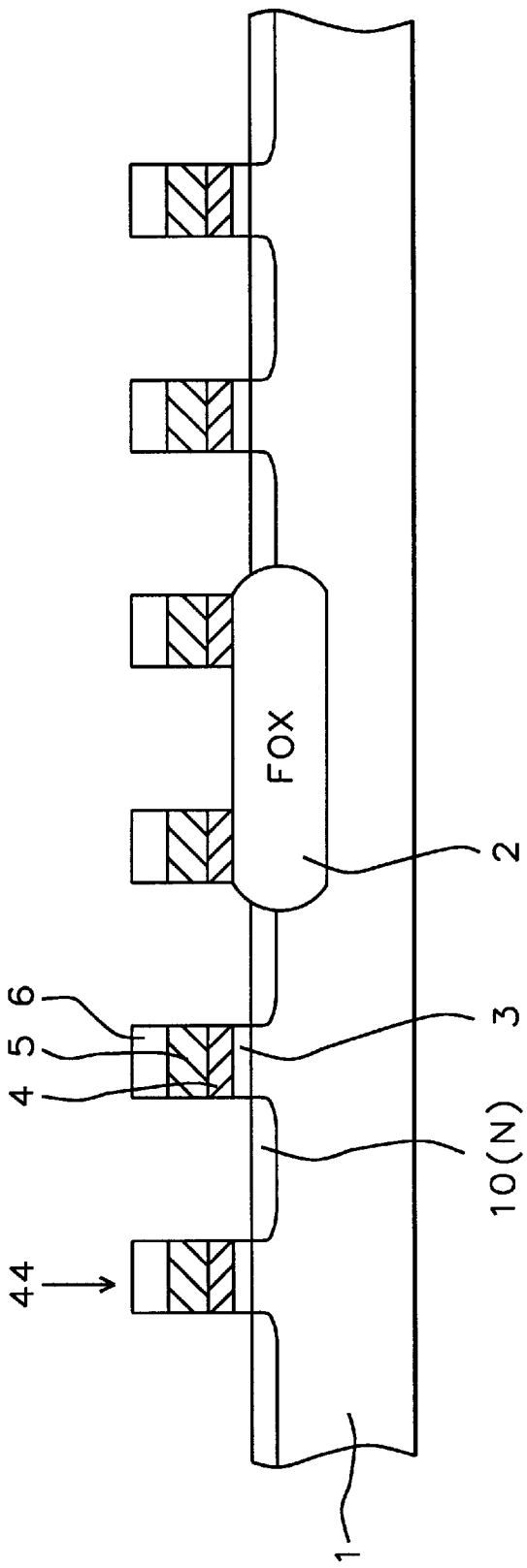

FIG. 1a, schematically shows the top view of a DRAM cell, at an early stage of fabrication, while FIG. 1b, describes the same stage of fabrication, via a cross-sectional representation. Referring first to FIG. 1b, a P type, semiconductor substrate, 1, with a <100>, single crystalline orientation, is used. A field oxide, (FOX), region 2, is used for purposes of isolation, formed via thermal oxidation, in an oxygen-steam ambient, at a temperature between about 850 to 1050° C., to a thickness between about 3000 to 5000 Angstroms. A patterned oxidation resistant mask of silicon nitride-silicon oxide is used to prevent FOX regions 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850 to 1050° C., to a thickness between about 50 to 200 Angstroms.

A polysilicon layer 4, is next deposited using low pressure chemical vapor deposition, (LPCVD), procedures, at a temperature between about 500 to 700° C., to a thickness between about 500 to 1000 Angstroms. The polysilicon can either be grown intrinsically and doped via ion implantation of arsenic or phosphorous, or polysilicon layer 4, can be grown using in situ doping procedures, via the incorporation of either arsine or phosphine to the silane ambient. A tungsten silicide layer 5, is next deposited via LPCVD procedures, at a temperature between about 400 to 600° C., to a thickness between about 500 to 1500 Angstroms, using silane and tungsten hexafluoride as a source. Finally a capping silicon nitride layer 6, is deposited, using either LPCVD or plasma enhanced chemical vapor deposition, (PECVD), procedures, to a thickness between about 1500 to 2500 Angstroms. Conventional photolithographic and reactive ion etching, (RIE), procedures, using $CHF_3$ as an etchant for silicon nitride layer 6, and using $Cl_2$ as an etchant for both tungsten silicide layer 5, and for polysilicon layer 5, are used to create the silicon nitride capped, polycide, (tungsten silicide-polysilicon), gate structure, used as word lines 44, for the DRAM structure. This is schematically shown in FIG. 1a. Removal of the photoresist layer, used as a mask for word line 44, definition, is accomplished via use of plasma oxygen ashing and careful wet cleans, removing gate insulator layer 3, in regions not covered by word line structures 44. A lightly doped source and drain region 10, is next formed via ion implantation of phosphorous, at an energy between about 20 to 50 KeV, at a dose between about 1E13 to 1E14 atoms/cm². This is also schematically shown in FIG. 1b. FIG. 1a, shows the top view of the DRAM structure, at this stage of processing.

Another silicon nitride layer is next deposited using either LPCVD or PECVD procedures, at a temperature between about 400 to 700° C., to a thickness between about 700 to 1200 Angstroms. An anisotropic RIE procedure, using $CHF_3$—$CF_4$ as an etchant is used to create silicon nitride spacers 7, on the sides of word line structures 44, shown schematically in FIG. 2b. The polycide word lines are now silicon nitride encapsulated with capping silicon nitride layer 6, and silicon nitride spacers 7. A heavily doped source and drain region 11, is then formed via ion implantation of arsenic or phosphorous, at an energy between about 30 to 80 KeV, at a dose between about 1E15 to 1E16 atoms/cm². A polysilicon layer is next deposited via LPCVD procedures, to a thickness between about 3000 to 6000 Angstroms, grown using in situ doping procedures via the incorporation of either arsine or phosphine into a silane ambient. This polysilicon layer can also be grown intrinsically, than doped via ion implantation of either arsenic or phosphorous. A planarization procedure, using either a chemical mechanical polishing, (CMP), procedure, or a RIE procedure, using $Cl_2$ as an etchant, is applied to create polysilicon contact plugs 50, schematically shown, in cross-sectional style in FIG. 2b.

Figure 2A:
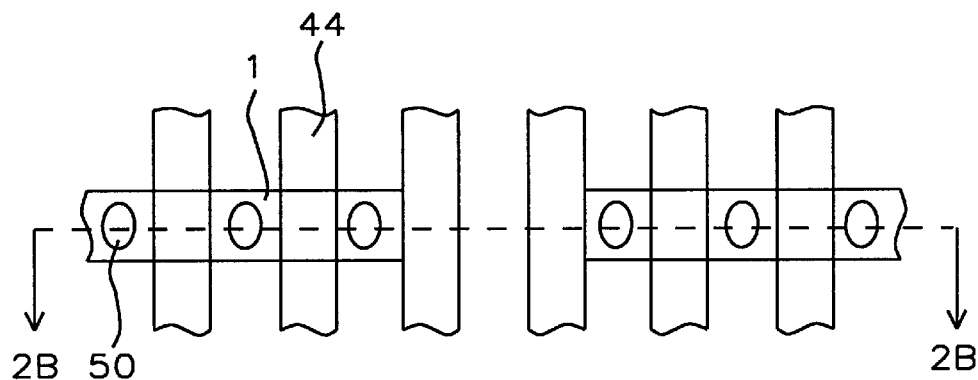
Figure 2B:
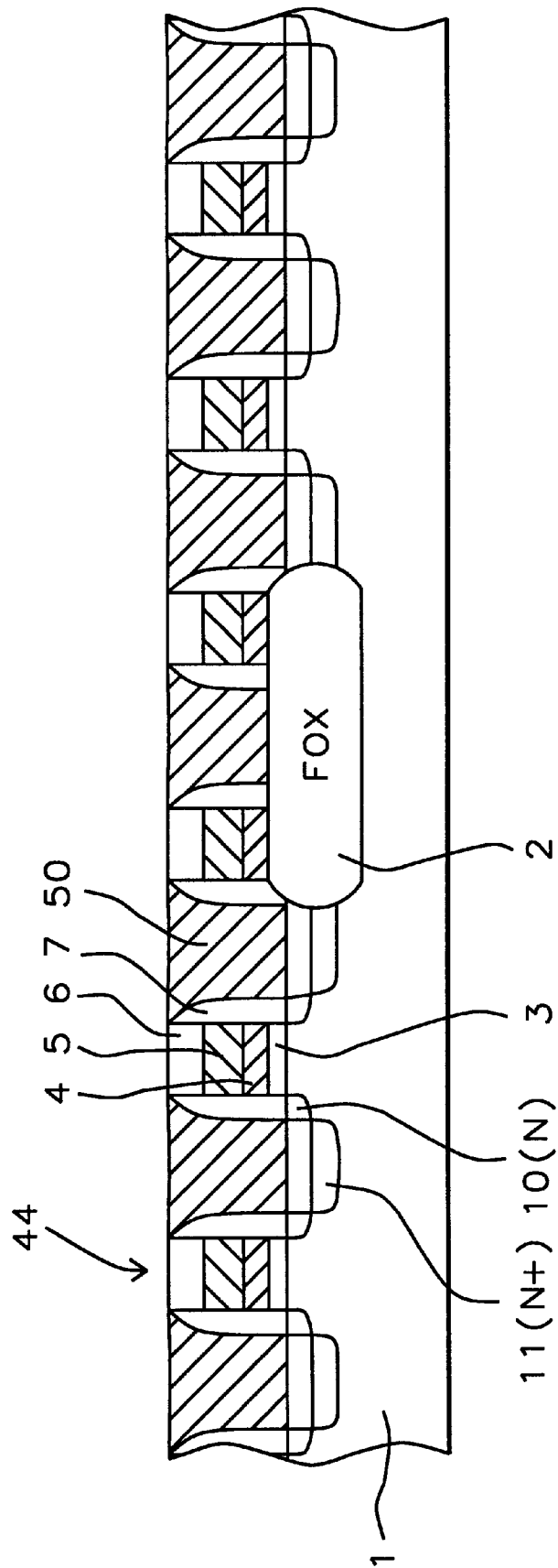

FIG. 2a, illustrates the top view of the DRAM device, showing polysilicon contact plugs 50, contacting active silicon device region 1, between word line structures 44.

Figure 3A:
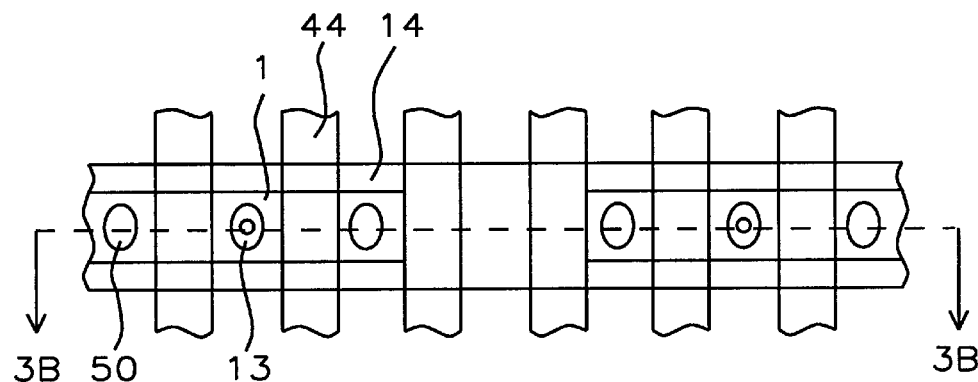
Figure 3B:
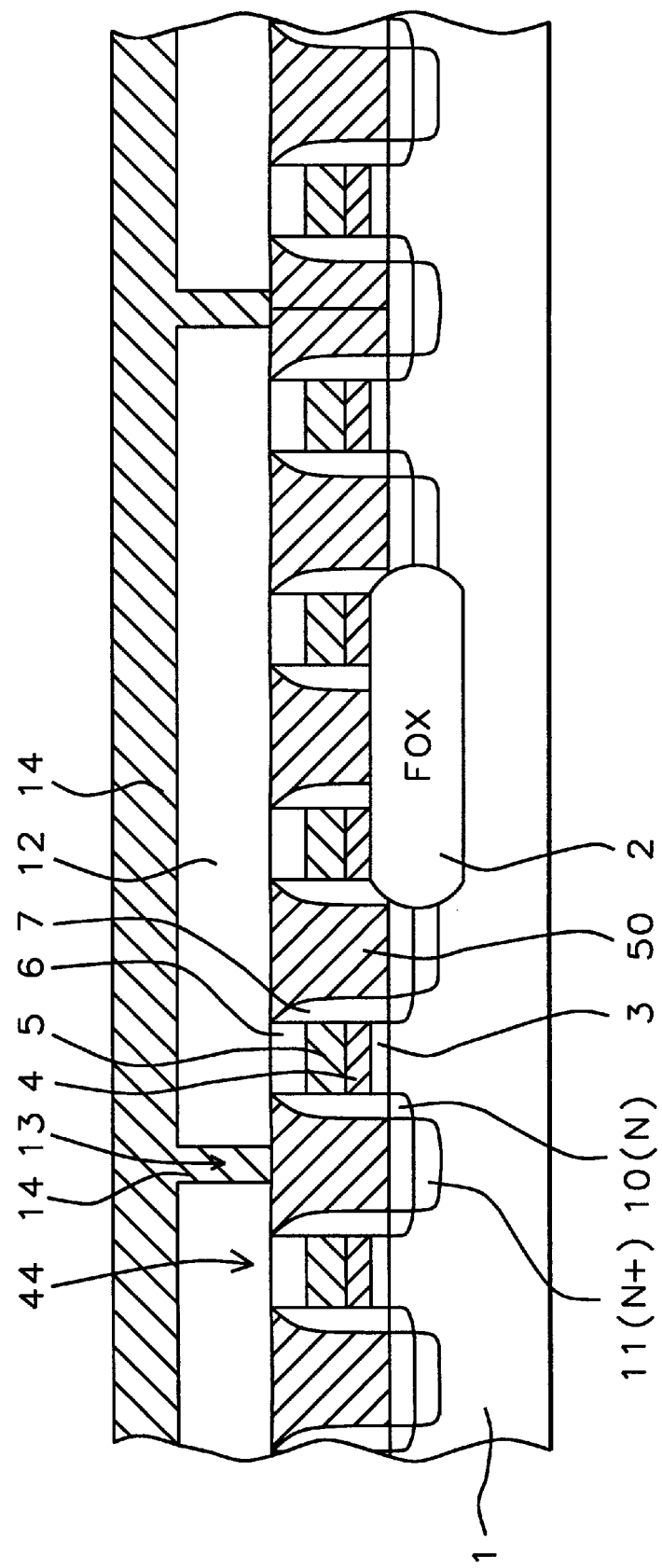
Figure 4A:
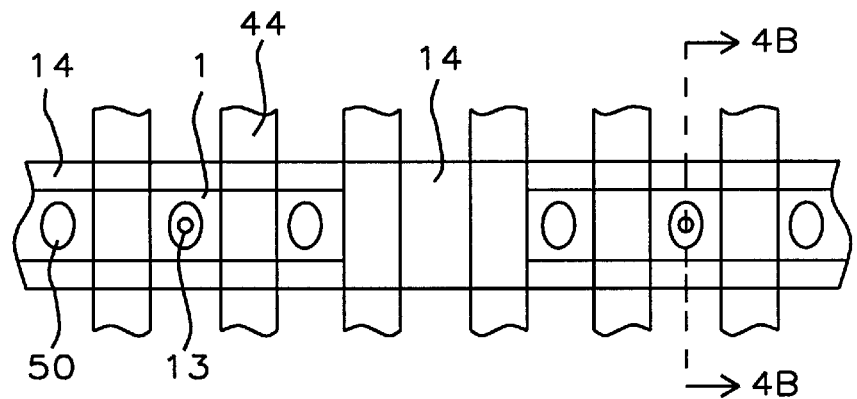

A silicon oxide layer 12, is deposited via LPCVD or PECVD procedures, using tetraethylorthosilicate, (TEOS) as a source, to a thickness between about 2000 to 4000 Angstroms. Conventional photolithographic and RIE procedures, using $CHF_3$ as an etchant, are used to open bit line contact holes 13, with a diameter between about 0.15 to 0.20 um, in silicon oxide layer 12, exposing the top surface of a polysilicon contact plugs 50, in which polysilicon contact plugs 50, contact underlying heavily doped source and drain regions 11. Photoresist removal is again performed via use of plasma oxygen ashing and careful wet cleans. A polysilicon layer is next deposited via LPCVD procedures, to a thickness between about 800 to 1200 Angstroms, completely filling bit line contact holes 13. The polysilicon layer is again doped via an in situ doping, or ion implantation procedure. Patterning of the polysilicon layer is accomplished via conventional photoresist processing, and an anisotropic RIE procedure using $Cl_2$ as an etchant. The result of these procedures, after removal of the masking photoresist layer, creating straight bit line shape 14, is schematically shown of the top view of the DRAM structure, in FIG. 3a, and shown in cross-sectional representation of the DRAM structure, schematically displayed in FIG. 3b.

Figure 4B:
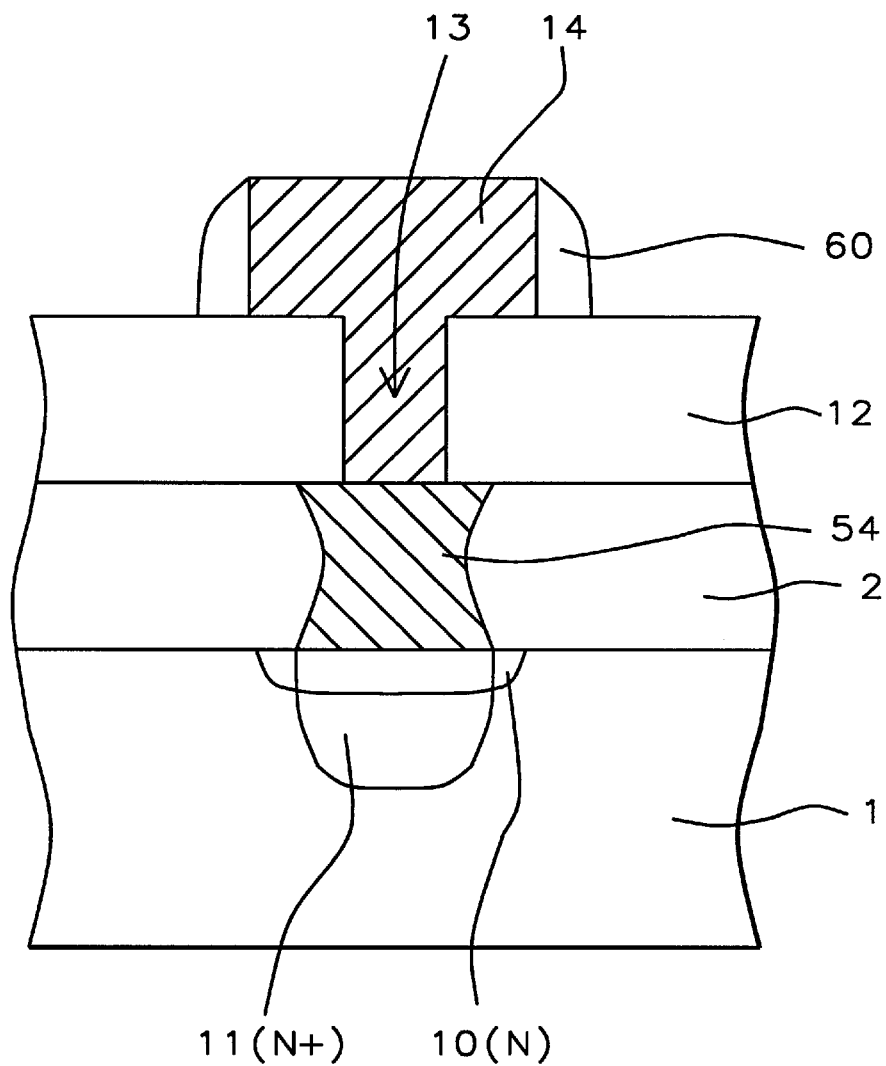

Straight bit line shape 14, featured in this invention, is enhanced via the creation of tungsten, or tungsten silicide spacers, on the sides of straight bit line shape 14. This is accomplished via deposition of tungsten, or tungsten silicide, using LPCVD procedures, or r.f. sputtering, to a thickness between about 400 to 800 Angstroms. An anisotropic RIE procedure, using $Cl_2$ as an etchant, is used to form tungsten, or tungsten silicide spacers 60, on the exposed sides of straight bit line shape 14. Tungsten, or tungsten silicide, is completely removed from regions between straight bit lines during the spacer formation. This is schematically, shown in cross-sectional style in FIG. 4b. The addition of the tungsten, or tungsten silicide spacers, lowers bit line resistance as well as providing a subsequent electrical connection surrounding the storage node contact and bit line structures. The width of the portion of straight bit line shape 14, overlying insulator layer 12, is between about 0.20 to 0.25 um, shown schematically in FIG. 4b.

Figure 5A:
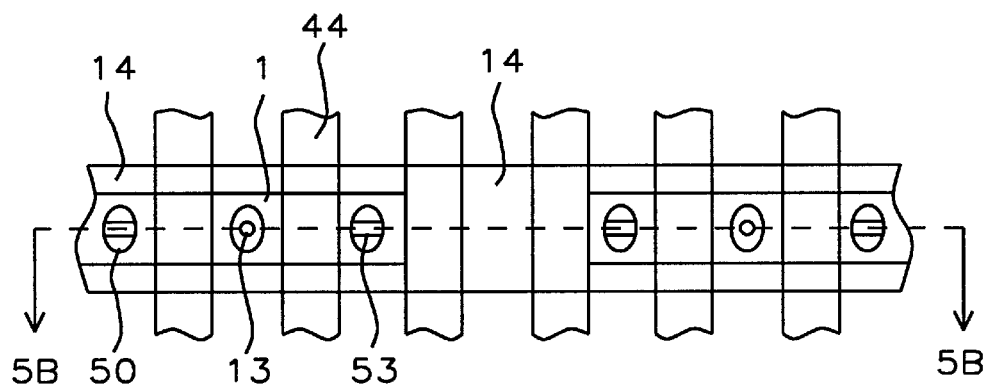
Figure 5B:
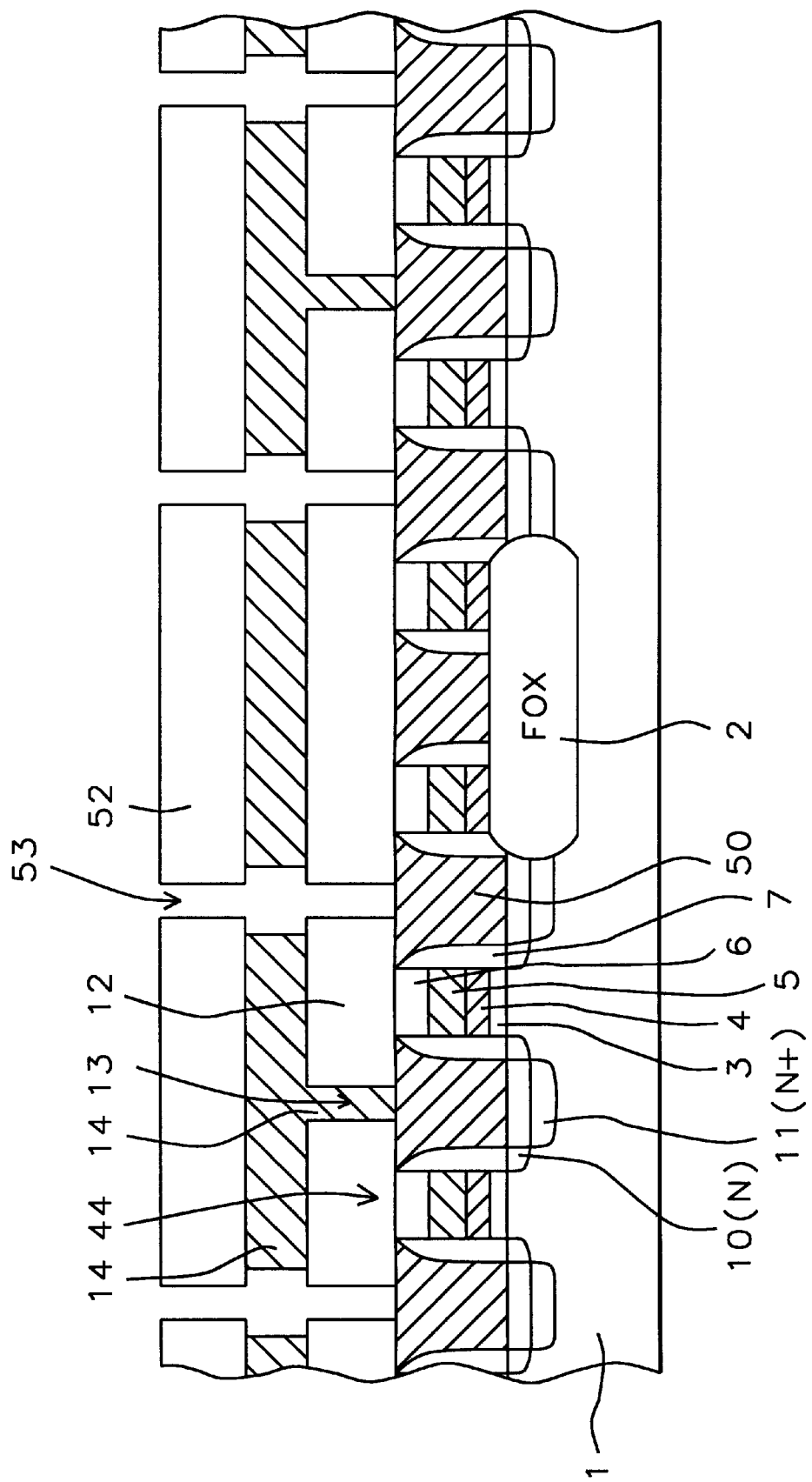

An insulator layer 52, of silicon oxide, is next deposited via LPCVD or PECVD procedures, at a temperature between about 300 to 500° C., to a thickness between about 2000 to 4000 Angstroms. Photolithographic and RIE procedures, are next employed to create storage node contact holes 53, exposing the top surface of polysilicon contact plugs 50. The RIE procedure consists of initially defining the storage node contact hole in insulator layer 52, using $CHF_3$ as an etchant, followed by a $Cl_2$ RIE procedure, resulting in the storage node contact hole 53, being extended through straight bit line shape 14, followed by another $Cl_2$—$CHF_3$ RIE procedure, used to complete the opening of storage node contact holes 53, through insulator layer 12. The RIE conditions, used to the open storage node contact hole, in the polysilicon, encased with a tungsten spacer, straight bit line shape 14, contain isotropic components, allowing the opening in the straight bit line shape to be wider in diameter, than the openings in the overlying and underlying insulator layers. The diameter of the storage node contact hole 53, in second insulator layer 52, and in first insulator layer 12, is between about 0.10 to 0.15 um, while the diameter of storage contact hole 53, in the polysilicon, straight bit line shape 14, is between about 0.20 to 0.25 um. Photoresist removal once again is accomplished using plasma oxygen ashing and careful wet cleans. This is schematically shown in the top view, presented in FIG. 5a, and in the cross-sectional view, presented in FIG. 5b.

Figure 6A:
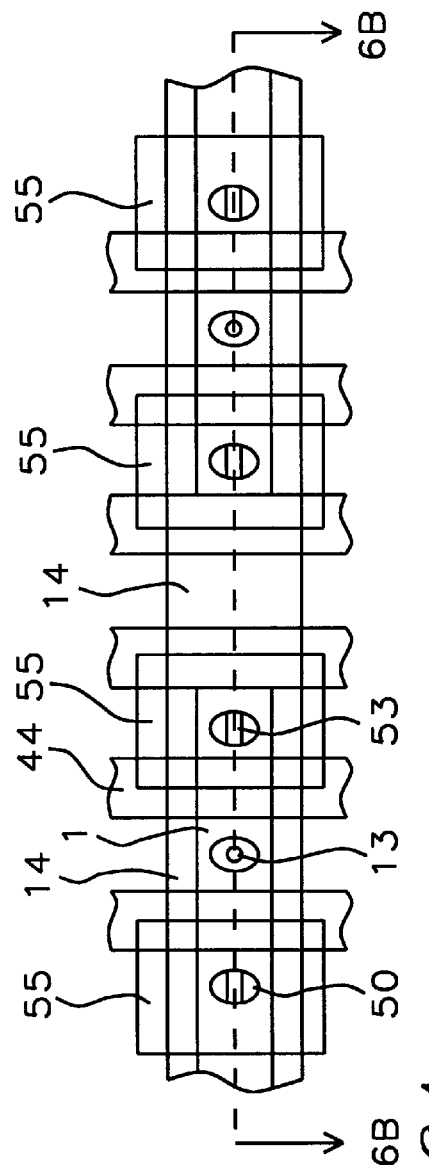
Figure 6B:
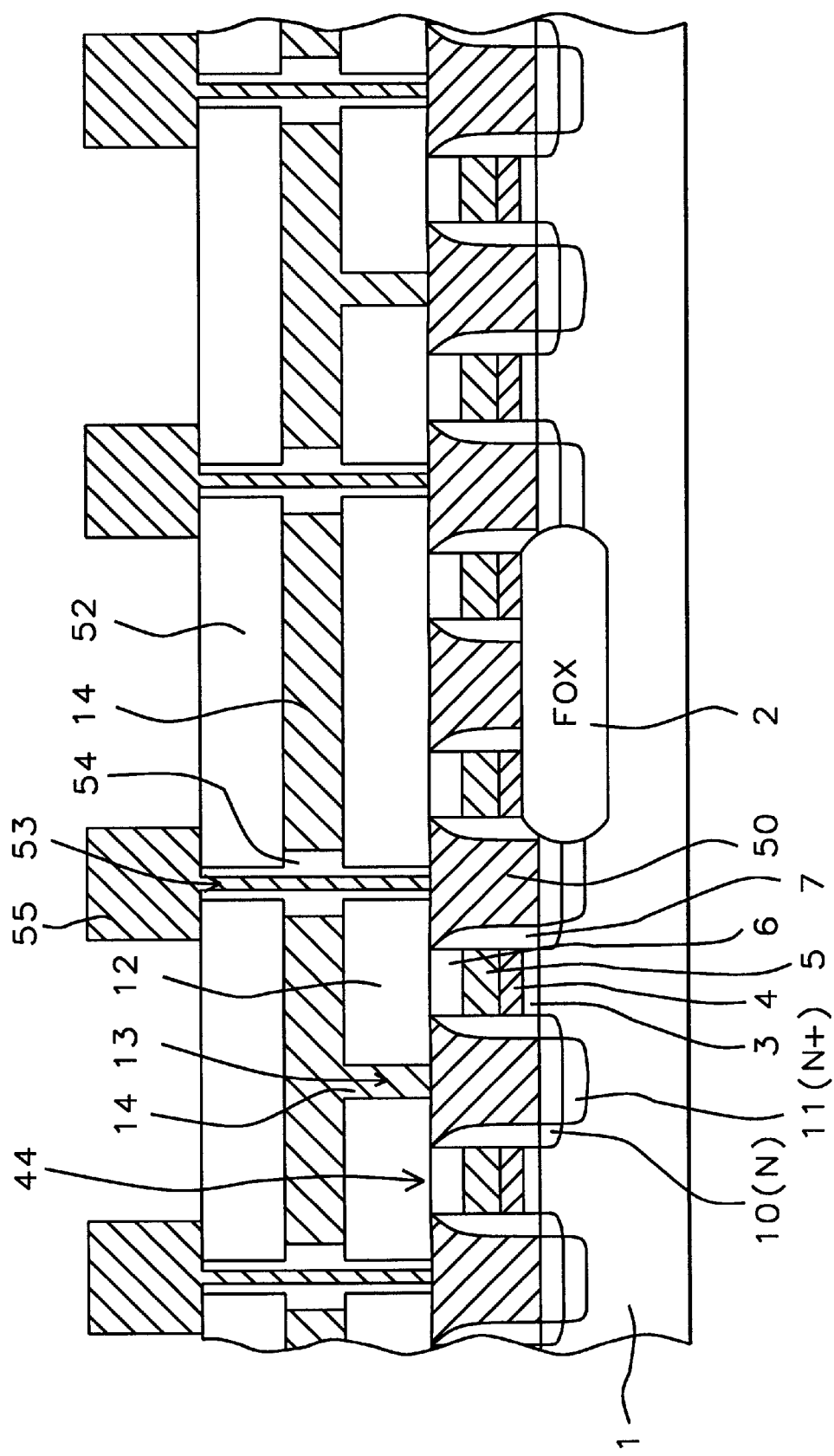

A critical aspect of this invention is the use of a straight bit line shape, that allows the formation of a storage node contact hole, directly through the bit line shape. This design allows increased device density to be achieved, compared to counterparts in which the storage node contact holes are formed in non-bit line regions. Thus the use of the storage node contact hole, through the polysilicon, straight bit line shape 14, requires the formation of insulator spacers on the sides of the storage node contact hole 53, to avoid contact between a subsequent storage node structure 55, and the polysilicon, straight bit line structure 14, exposed in storage node contact hole 53. This is accomplished via the deposition of a silicon nitride layer, using LPCVD or PECVD procedures, at a temperature between about 600 to 700° C., to a thickness between about 300 to 500 Angstrom, followed by an anisotropic RIE procedure, using $CHF_3$—$CF_4$ as an etchant, creating silicon nitride spacers 54, on the sides of storage node contact hole 53. This is schematically shown in FIG. 6b. The wider opening in storage node contact hole 53, in the polysilicon, straight bit line shape, allows for the formation of a thicker silicon nitride spacer, between about 600 to 800 Angstroms, in that undercut region, thus offering additional insulator protection for that critical region.

The creation of storage node structures 55, are next addressed by deposition of a polysilicon layer, via a LPCVD procedure, at a thickness between about 5,000 and 10,000 Angstroms. Then polysilicon layer is either grown using in situ doping procedures, or grown intrinsically and doped via ion implantation procedures. Conventional photolithographic and RIE procedures, using $CL_2$ as an etchant, are used to create storage node structure 55, schematically shown in FIG. 6a, (top view), and cross-sectionally in FIG. 6b. Removal of photoresist is accomplished using plasma oxygen ashing and careful wet cleans. The storage node structures 55, contacts the underlying polysilicon contact plugs, in the storage node contact hole 53, through the straight bit line shape 14, coated with silicon nitride spacers 54. The DRAM device is completed by forming a capacitor dielectric layer on the storage node structure, followed by the creation of an upper plate structure.

While this invention has been particularly shown and described with reference to, the preferred embodiments thereof, it will be understood by those skilled in the art that various changes in form and details may be made without departing from the spirit and scope of this invention.

What is claimed is:

1. A capacitor over bit line, (COB), DRAM structure, on a semiconductor substrate, featuring a straight bit line shape, and a storage node contact hole, through the straight bit line shape, comprising:

polycide gate structures, on a gate insulator layer, capped with an overlying silicon nitride layer, and with first silicon nitride spacers on the sides of the polycide gate structures;

source and drain regions in said semiconductor substrate, between said polycide gate structures;

a first polysilicon contact plug, located between a first group of polycide gate structures, overlying a first source and drain region, and a second polysilicon contact plug, located between a second group of polycide gate structures, overlying a second source and drain region;

a first insulator layer, with a bit line contact hole in said first insulator layer, exposing the top surface of said first polysilicon contact plug;

a bit line contact structure, in said bit line contact hole, contacting said first polysilicon contact plug;

a straight bit line shape, on said first insulator layer, contacting underlying said bit line contact structure, with said straight bit line shape comprised of polysilicon at a thickness between about 800 to 1200 Angstroms, and with said straight bit line shape comprised with a width between about 0.20 to 0.25 um, and with tungsten or tungsten silicide spacers located on the sides of said straight bit line shape, with said spacers at a thickness between about 400 to 800 Angstroms;

a second insulator layer on said straight bit line shape, and on said first insulator layer, in regions in which said first insulator layer is not covered by said straight bit line shape;

a storage node contact hole, in said second insulator layer, in said straight bit line shape, and in said first insulator layer, exposing the top surface of said second polysilicon contact plug, with the diameter of said storage node contact hole, wider in said straight bit line shape, than in said second insulator layer, and in said first insulator layer;

second silicon nitride spacers on the sides of said storage node contact hole, with second silicon nitride spacers thicker on sides of said straight bit line shape, than on sides of said second insulator layer, and the sides of said first insulator layer; and a storage node structure, on the top surface of said second insulator layer, and completely filling said storage node contact hole, overlying and contacting, said second polysilicon contact plug.

2. The COB, DRAM structure of claim 1, wherein said bit line contact structure, is comprised of polysilicon, with a diameter between about 0.15 to 0.20 um.

3. The COB, DRAM structure of claim 1, wherein said storage node contact hole has a diameter between about 0.10 to 0.15 uM, in said second insulator layer, and in said first insulator layer, and a diameter between about 0.20 to 0.25 um, in said straight bit line shape.

4. The COB, DRAM structure of claim 1, wherein said second silicon nitride spacers, on the sides of said storage node contact hole, has a thickness between about 300 to 500 Angstroms, on the sides of said second insulator layer, and on the sides of said first insulator layer, and a thickness between about 600 to 800 Angstroms, on the sides of said straight bit line shape.

* * * * *